United States Patent
Bahr et al.

(10) Patent No.: US 11,387,919 B2
(45) Date of Patent: Jul. 12, 2022

(54) HIGH FREQUENCY CMOS ULTRASONIC TRANSDUCER

(71) Applicant: Texas Instruments Incorporated, Dallas, TX (US)

(72) Inventors: Bichoy Bahr, Allen, TX (US); Benjamin Stassen Cook, Los Gatos, CA (US); Scott Robert Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 350 days.

(21) Appl. No.: 16/590,354

(22) Filed: Oct. 1, 2019

(65) Prior Publication Data
US 2021/0099237 A1   Apr. 1, 2021

(51) Int. Cl.
*H04B 11/00* (2006.01)
*H01L 29/51* (2006.01)
*G01N 29/24* (2006.01)

(52) U.S. Cl.
CPC ............ *H04B 11/00* (2013.01); *H01L 29/516* (2013.01); *G01N 29/2406* (2013.01)

(58) Field of Classification Search
CPC .... H04B 11/00; H01L 29/516; G01N 29/2406
See application file for complete search history.

(56) References Cited

U.S. PATENT DOCUMENTS

| 5,679,753 A | 10/1997 | Ohigashi et al. |
| 9,899,363 B1 | 2/2018 | Bahr et al. |
| 9,997,695 B2 | 6/2018 | Krivokapic et al. |
| 10,084,426 B2 | 9/2018 | Bahr et al. |
| 2008/0269614 A1 | 10/2008 | Adachi et al. |
| 2015/0251896 A1 | 9/2015 | Rothberg et al. |
| 2017/0243875 A1 | 8/2017 | Khan |

OTHER PUBLICATIONS

Search Report for PCT Application No. PCT/US2020/053771, date of mailing of the international search report, dated Jan. 14, 2021, 1 page.
"FRAM—New Generation of Non-Volatile Memory", Texas Instruments, Inc., Brochure SZZT014A, 2009, pp. 1-2.
"Ultrasonic Transducer", Wikipedia, available at https://en.wikipedia.ort/wiki/Ulllasonic_transducer on Jun. 25, 2019, pp. 1-2.
Bichoy Waguih Azmy Bahr, "Monolithically Integrated MEMS Resonators and Oscillators in Standard IC Technology", Thesis, Massachusetts Institute of Technology, May 18, 2016, pp. 1-255.
"DC-70", Solokrafts Industries, available at https://www.solokrafts.com/product/dc-70/ on Jun. 21, 2019, pp. 1-5.

(Continued)

*Primary Examiner* — Isam A Alsomiri
*Assistant Examiner* — Abdallah Abulaban
(74) *Attorney, Agent, or Firm* — Michael A. Davis, Jr.; Charles A. Brill; Frank D. Cimino

(57) ABSTRACT

In described examples of a CMOS IC, an ultrasonic transducer having terminals is formed on a substrate of the IC. CMOS circuitry having ultrasonic signal terminals is formed on the substrate. At least one metal interconnect layer overlies the ultrasonic transducer and the CMOS circuitry. The at least one metal interconnect layer connects the CMOS circuitry ultrasonic signal terminals to the terminals of the ultrasonic transducer.

7 Claims, 10 Drawing Sheets

(56) References Cited

OTHER PUBLICATIONS

Sina Akhbari et al, "Highly Responsive Curved Aluminum Nitride PMUT", 2014 IEEE 27th International Conference on Micro Electro Mechanical Systems (MEMS), San Francisco, CA, Jan. 26-30, 2014, pp. 1-4.
David A. Horsley et al, "Ultrasonic fingerprint sensor based on a PMUT array bonded to CMOS circuitry", 2016 IEEE International Ultrasonics Symposium Proceedings (IUS), Tours, France, Sep. 18-21, 2016, pp. 1-4.
Justin C. Kuo et al, "64-Pixel Solid State CMOS Compatible Ultrasonic Fingerprint Reader", 2017 IEEE 30th International Conference on Micro Electro Mechanical Systems (MEMS), Las Vegas, NV, Jan. 22-26, 2017, pp. M.
Xiaoyue Jiang et al, "Ultrasonic Fingerprint Sensor With Transmit Beamforming based on a PMUT Array Bonded to CMOS Circuitry", IEEE Transactions on Ultrasonics, Ferroelectrics, and Frequency Control, vol. 64, No. 9, Sep. 2017, pp. 1-8.

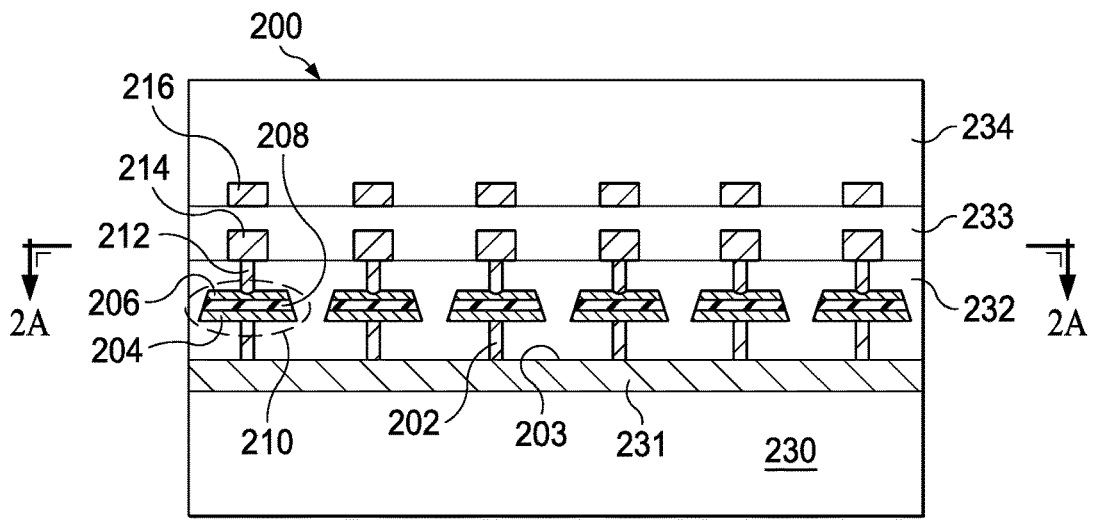
FIG. 2B
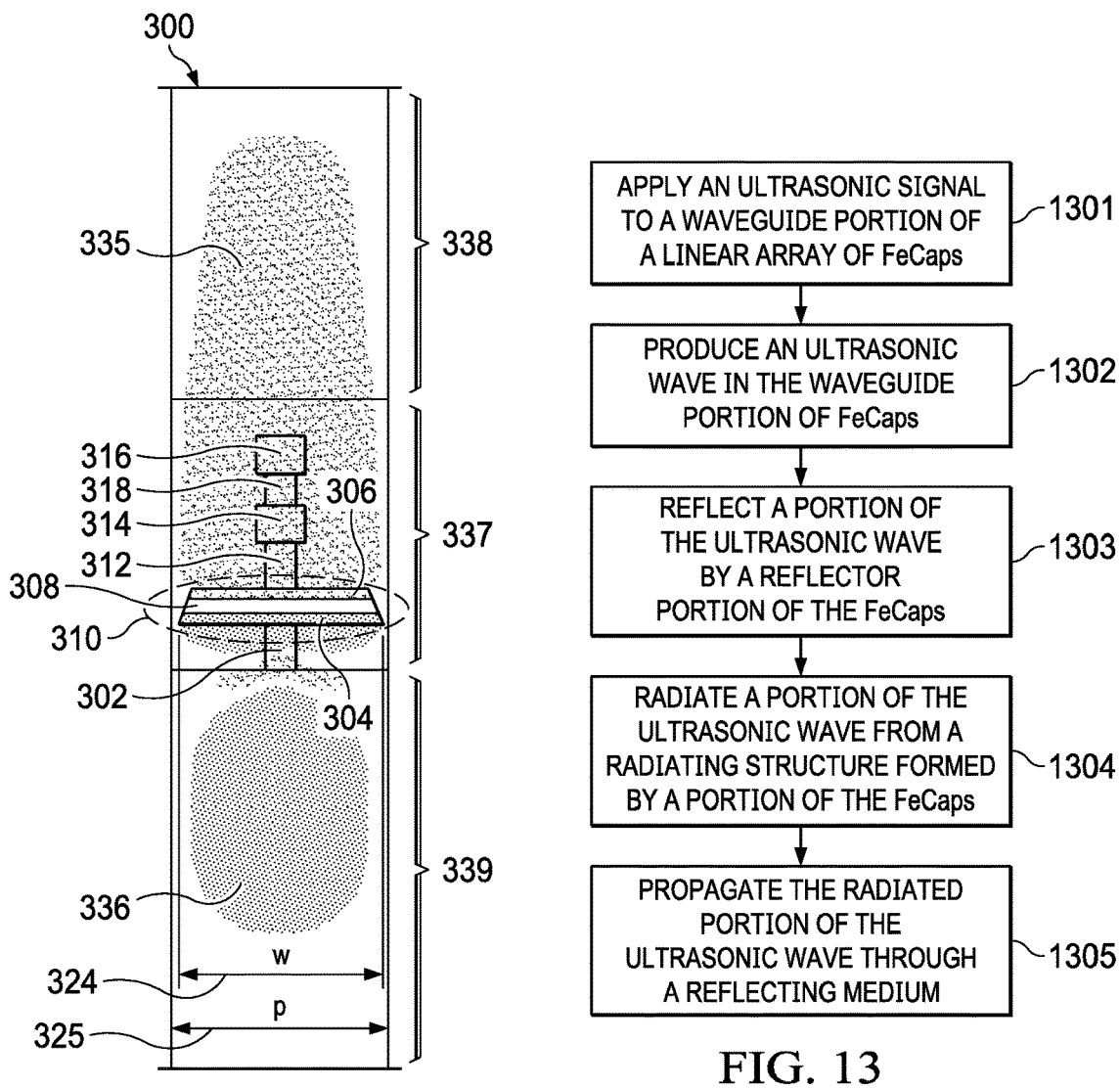
FIG. 3
FIG. 13

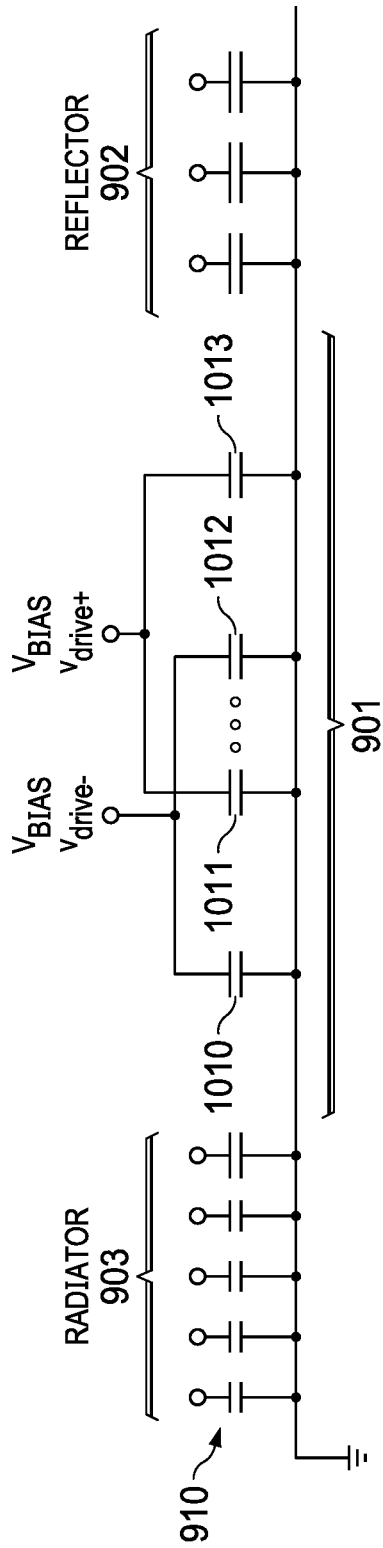
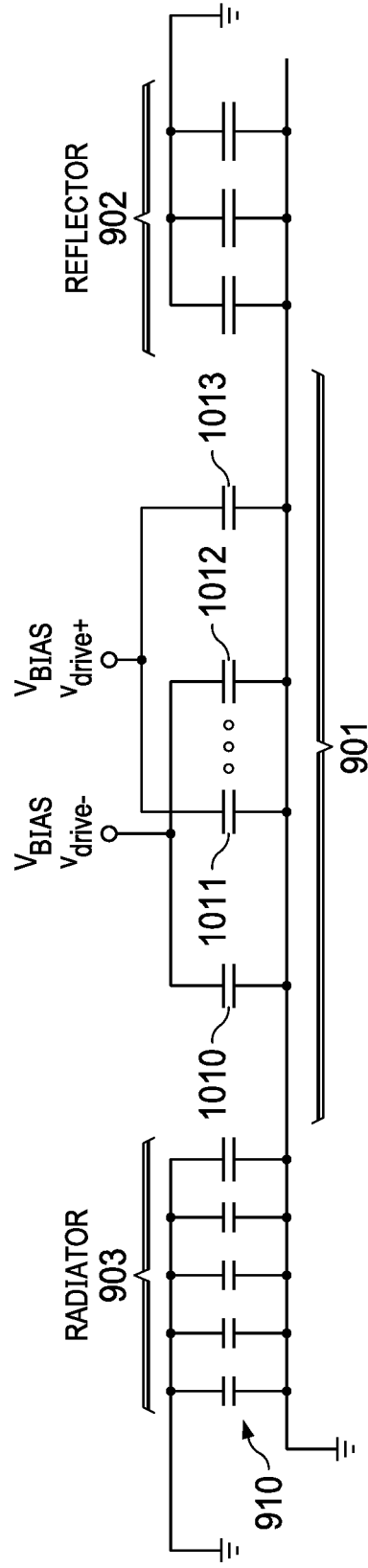
FIG. 10A
FIG. 10B

HIGH FREQUENCY CMOS ULTRASONIC TRANSDUCER

TECHNICAL FIELD

This relates to high frequency ultrasonic transducers that are formed within a complimentary metal-oxide semiconductor (CMOS) integrated circuit.

BACKGROUND

Ultrasonic transducers and sensors are acoustic devices divided into three broad categories: transmitters, receivers and transceivers. Transmitters convert electrical signals into ultrasound, receivers convert ultrasound into electrical signals, and transceivers can both transmit and receive ultrasound.

Ultrasonic transducers are used in systems that evaluate targets by interpreting the reflected signals, similar to radar. The transmit signal includes short bursts of ultrasonic energy. After each burst, the electronics looks for a return signal within a small window of time corresponding to the time it takes for the energy to pass through the media. Only signals received during this period will be used for additional signal processing.

Medical ultrasonic transducers (probes) come in a variety of different shapes and sizes for use in making cross-sectional images of various parts of the body. The transducer may be passed over the surface and in contact with the body. An array of ultrasonic transducers can be used to sense fingerprints to control access, such as for a laptop computer or a mobile phone.

Ultrasonic sensors are widely used in cars as parking sensors to aid the driver in reversing into parking spaces. They are being tested for a number of other automotive uses including ultrasonic people detection and assisting in autonomous UAV navigation.

SUMMARY

In described examples of a CMOS IC, an ultrasonic transducer having terminals is formed on a substrate of the IC. CMOS circuitry having ultrasonic signal terminals is formed on the substrate. At least one metal interconnect layer overlies the ultrasonic transducer and the CMOS circuitry. The at least one metal interconnect layer connects the CMOS circuitry ultrasonic signal terminals to the terminals of the ultrasonic transducer.

BRIEF DESCRIPTION OF THE DRAWINGS

FIG. 2A, 2B are respective top and side cross-sectional views of a row of FeCaps used to form an ultrasonic transducer.

FIG. 3 is a cross-sectional view of a single simulated FeCap illustrating simulated electric fields surrounding the FeCap.

FIGS. 10A, 10B, 10C are schematics of various example FeCap connections.

FIG. 13 is a flow diagram illustrating operation of an ultrasonic transmitter on a CMOS IC.

DETAILED DESCRIPTION

Figure 1:
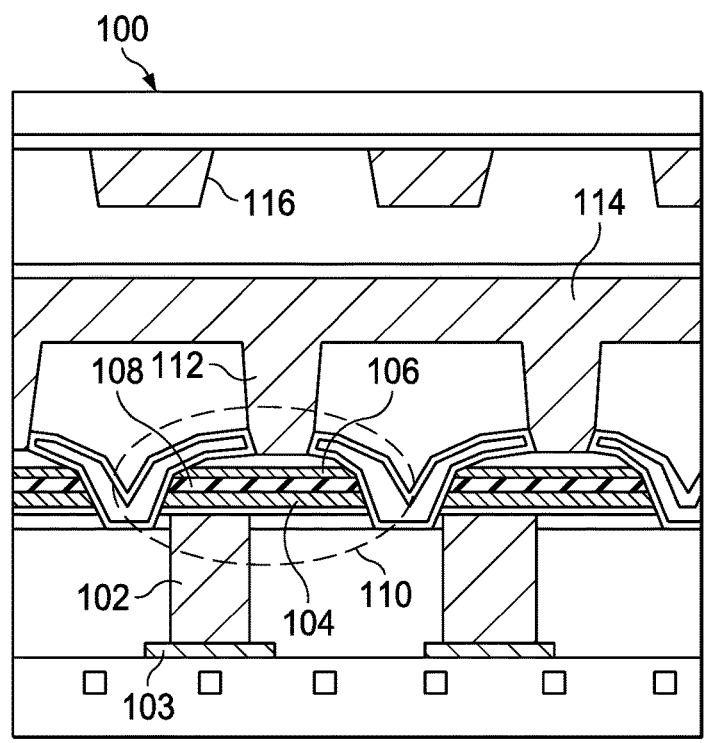
FIG. 1 is a cross-sectional view of an integrated circuit (IC) that includes memory cells using ferroelectric capacitors (FeCaps) as storage elements.

In the drawings, like elements are denoted by like reference numerals for consistency.

Piezoelectric micromachined ultrasonic transducer (PMUT) array technology is currently used to perform ultrasonic imaging for medical applications to take images of soft tissues such as muscles, internal organs, blood flow, fetal observation, etc. Advancements of microelectromechanical systems (MEMS) have produced ultrasonic transducers based on plate flexural mode with good improvements in bandwidth, cost, and yield over the conventional large scale, thickness-mode PZT sensors. However, currently available PMUT based transducers have a limited operating frequency due to the limits of their flexural modes, typically in the range of 2-14 MHz. Low frequency operation results in low resolution images. Furthermore, these arrays are typically fabricated on a substrate that then is bonded to a complementary metal oxide semiconductor (CMOS) integrated circuit (IC) that includes the electronics used to control the array. This results in complex packaging and integration issues.

Ferroelectric random-access memory (FRAM) is a non-volatile memory technology with similar behavior to DRAM (dynamic random access memory). Each individual bit can be accessed, but unlike EEPROM (electrically erasable programmable read only memory) or Flash, FRAM does not require a special sequence to write data nor does it require higher programming voltages. Each ferroelectric memory cell contains one or more ferroelectric capacitors (FeCap). The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. These small shifts in atomic positions produce a piezoelectric effect.

Ferroelectricity is a characteristic of certain materials that have a spontaneous electric polarization that can be reversed by the application of an external electric field. A ferroelectric material is normally in single crystalline or polycrystalline form and possesses a reversible spontaneous polarization over a certain temperature range. A known ferroelectric material is lead zirconate titanate (PZT), which is part of the solid solution formed between ferroelectric lead titanate and anti-ferroelectric lead zirconate. Different compositions are used for different applications; for memory applications, PZT closer in composition to lead titanate is preferred, whereas piezoelectric applications make use of the diverging piezoelectric coefficients associated with the morphotropic phase boundary that is found close to a 50/50 composition.

As will be described in more detail hereinbelow, FeCaps can be used as a means to generate stress and strain inside a CMOS IC itself to form an ultrasonic transducer device and thereby eliminate the need for a separate array substrate. A periodic array of the FeCaps is arranged to create an acoustic waveguide that can guide the generated waves along the front end of line (FEOL) layers of a CMOS die. FEOL is the first portion of IC fabrication where the individual devices (transistors, capacitors, resistors, etc.) are patterned in the semiconductor. FEOL generally covers everything up to, but not including, the deposition of metal interconnect layers. Deposition of metal layers and intervening dielectric layers and vias is performed during the back end of line (BEOL) processing.

By adjusting the dimensions of the FeCaps in the array, the waveguide characteristics can be manipulated to create reflectors and radiators that help guide acoustic waves produced by the piezoelectric activity of the array of FeCaps. A transducer can be operated in a transmit and/or a receive mode. FeCap arrays can produce very high-frequency ultrasound transducers that are truly integrated in CMOS technology for high-resolution short-range applications. Examples described hereinbelow operate at frequencies as high as 700+ MHz.

FIG. 1 is a cross-sectional view of a portion of a prior art integrated circuit 100 that includes memory cells using ferroelectric capacitors (FeCaps) 110 as storage elements. Ferroelectric random-access memories have been implemented in several configurations. A one transistor, one capacitor (1T-1C) storage cell design in a FeRAM array is similar in construction to the storage cell in widely used DRAM in that both cell types include one capacitor and one access transistor. In a DRAM cell capacitor, a linear dielectric is used, whereas in a FeRAM cell capacitor the dielectric structure includes ferroelectric material, typically lead zirconate titanate (PZT).

FeCap 110 is representative of a large number of FeCaps that are included in IC 100. FeCap 110 has a bottom plate 104 and a top plate 106 patterned from a conductive layer. Dielectric PZT material 108 is sandwiched between lower plate 104 and upper plate 106 to form a capacitor configuration. Via 102 connects a conductive signal line 103 to lower plate 104. Via 112 connects a conductive signal line in a first metal layer 114 to upper plate 106. A second metal layer 116 provides an additional signal routing layer that is interconnected with vias (not shown) to signal lines in first metal layer 114.

Figure 2A:
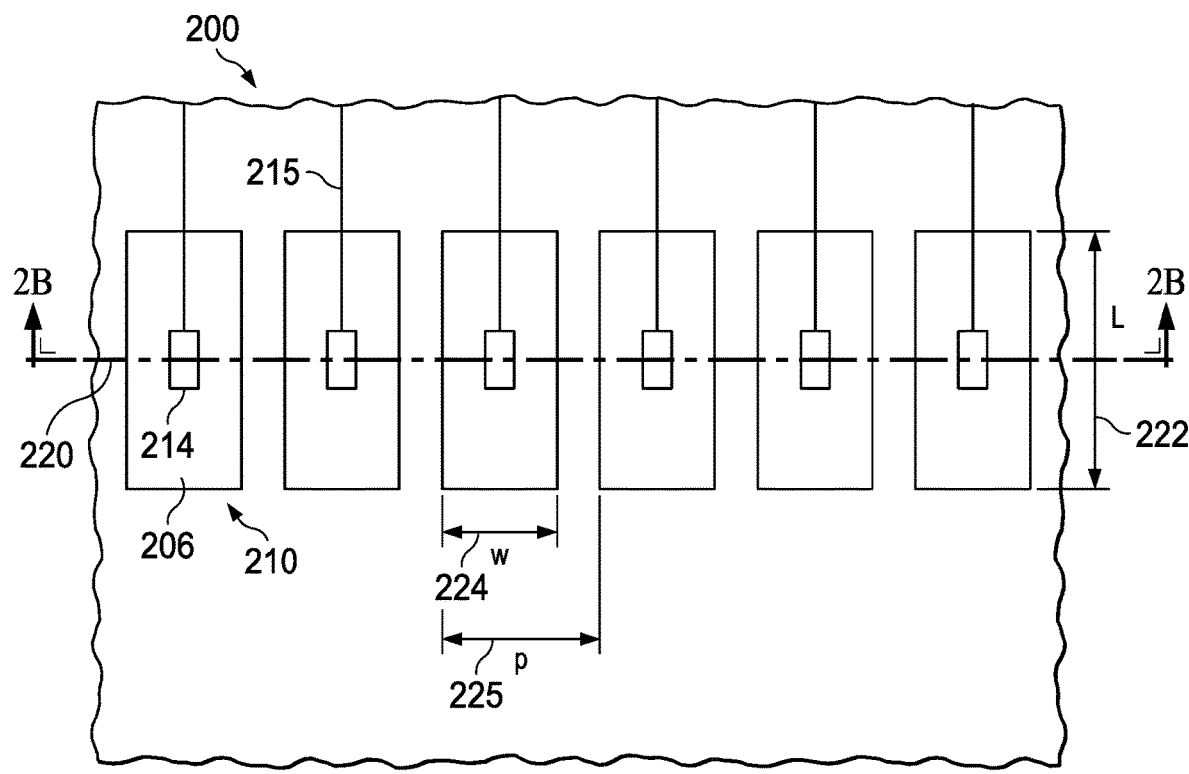

FIG. 2A is a top cross-sectional view of a portion of a CMOS IC 200 that includes row of FeCaps used as an ultrasonic transducer that is fabricated within CMOS IC 200. FIG. 2B is a side cross-sectional view of the portion of CMOS IC 200. FeCap 210 is representative of a linear array of FeCaps that is included in IC 200. FeCap 210 has a bottom plate 204 and a top plate 206 patterned from a conductive layer. Ferroelectric PZT material 208 is sandwiched between lower plate 204 and upper plate 206 to form a capacitor configuration. Via 202 connects a conductive signal line 203 to lower plate 204. Via 212 connects a contact 214 and thereby a conductive signal line 215 in a first metal layer to upper plate 106. A contact 216 in a second metal layer provides an additional signal routing layer that is interconnected with vias (not shown) to signal lines in the first metal layer.

A linear array of FeCaps 210 is formed along an axis 220. Each FeCap 210 has a width (w) 224 and a length (L) 222. The linear array of FeCaps is arranged to have a pitch (p) 225. The array of FeCaps is arranged such that the length 222 of each FeCap 210 is perpendicular to the axis 220. As will be described in more detail hereinbelow, the respective width and pitch of the FeCaps in the linear array are selected to produce an ultrasonic wave in a central portion of the linear array, prevent the ultrasonic wave from dispersing from one end of the linear array, and to cause the ultrasonic wave to "leak" or disperse from the other end of the linear array to thereby from an ultrasonic transmitter. In this example, the length L is 10 µm. In another example L may be larger or smaller for corresponding signal strength.

Substrate 230 is bulk silicon in this example. On top of the substrate 230 n+ and p+ wells are formed, providing a region for CMOS transistors implantation. FeCaps 210 are also formed on N-well layer 231 using known or later developed fabrication techniques during the FEOL processing of CMOS IC 200. Contacts 214, 216 and vias 212 are formed during BEOL processing of CMOS IC 200 using known or later developed fabrication techniques. In this example, silicon dioxide layers 232, 233, 234 provide electrical insulation around and between the first and second metal layers and contacts such as contacts 214, 216. In other examples, various types of known or later developed interconnect dielectric layers may be used between multiple metal layers.

FeCaps 210 are fabricated during the FEOL processing of CMOS IC 200 using known or later developed fabrication techniques. A first conductive layer that forms the bottom plates 204 may be deposited on substrate 200. The ferroelectric layer that forms the FeCap is then deposited over the first conductive layer. A second conductive layer is then deposited over the ferroelectric layer. An etch process is then performed to form the individual plates of the linear array of FeCaps. In another example, each layer may be patterned and etched individually. The first and second conductive layers that form the plates of the linear array of FeCaps are a metallic alloy in this example.

FIG. 3 is a cross-sectional view of a single simulated FeCap 310 illustrating simulated electric fields surrounding the FeCap. In order to better understand the operation of ultrasonic transducers based on FeCaps, simulations are performed on a structure similar to FeCap 210 of FIG. 2A, 2B using a numerical finite element method (FEM) simulation tool. Two-dimensional (2D) and three-dimensional (3D) FEM simulation tools are available from a number of vendors.

In this example, simulation unit cell 300 includes a region 337 that simulates the mechanical and material properties of a selected FEOL CMOS process to simulate the structure of FeCap 310 that includes a lower plate 304, upper plate 306, PZT layer 308, and via 302. Region 337 also simulates the mechanical and material properties of a selected BEOL CMOS process to simulate the structure of vias 312, 318 and contacts 314, 316. Region 337 also simulates dielectric layers that surround the vias and contacts, such as layers 232, 233, 234 of FIG. 2B. A regular IC passivation process for the selected CMOS process is assumed at the end (silicon dioxide, silicon nitride, etc. . . . ). FeCap 310 has a width 324 and a pitch 325 for adjacent FeCaps. For this simulation, the length of FeCap 310 is perpendicular to the view and is considered to be infinite into and out of the plane of the view.

Regions 338, 339 represent "perfectly matched layers" (PML) that are added to allow the simulated behavior of ultrasonic radiation produced by FeCap 310 to be studied in an assumed infinitely extended plane. PMLs 338, 339 have respective simulated properties that match the region of 337 to which they are adjacent. In this example, PML 338 matches the dielectric of region 337 above FeCap 310, while PML 339 matches the silicon substrate below FeCap 310.

Since the goal is to simulate a resonator, a wave on the left side must be related to a wave on right side with a constant phase shift. Thus, the wave vector times separation (pitch 325) must be a constant value. Multiple eigen-frequency simulations are performed to find out all the possible propagating modes in the structure, given a constant phase shift. Various traveling and evanescent waves are formed depending on the phase shift, frequency, and material properties. An evanescent field, or evanescent wave, is an oscillating field that does not propagate but whose energy is spatially concentrated in the vicinity of the source. Shaded regions 335, 336 illustrate an evanescent field. The simulated results may be illustrated by a dispersion plot.

Figure 4:
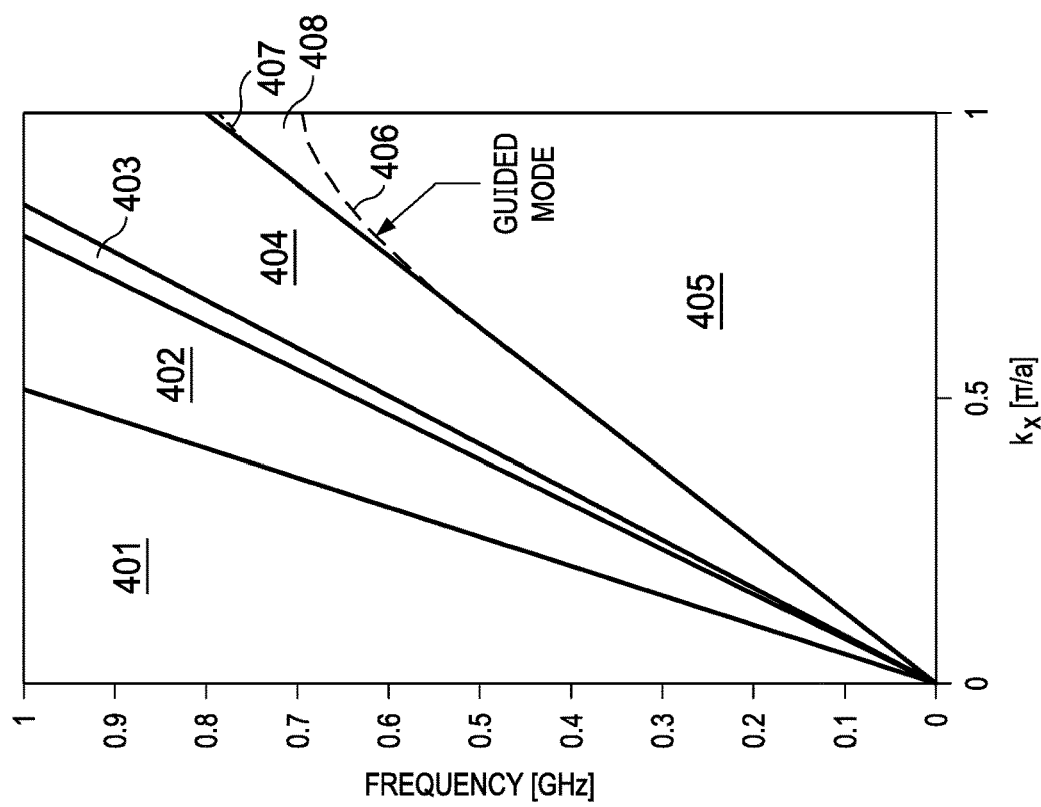
FIG. 4 is a dispersion plot of various modes within the FeCap structure of FIG. 3.

FIG. 4 is a dispersion plot of various modes within the FeCap structure of FIG. 3. In this plot, $k_x$ is a wave vector in the x direction, "a" is the period of the structure. When $k_x$ times "a" equals $\pi$, then a 180 degree shift is present between the left and right boundaries of the unit cell. When $k_x$ times "a" equals 0, then a 0-degree phase shift is present.

There are two kinds of waves that can propagate in solids: longitudinal waves and shear waves. Longitudinal waves have faster sound velocity than shear waves. Each type of wave will have its own sound cone. Hence, one sound cone 401 with a steep slope for longitudinal waves in bulk silicon, one with slightly shallower slope for shear waves in bulk silicon, and two similar cones with lower slope for the interlayer dielectric.

In the plot, sound cone area 401 represents all the longitudinal waves that can propagate into the bulk silicon that forms the substrate, such as substrate 230 in FIG. 2. Sound cone area 402 represents the shear waves that can propagate in the bulk silicon. Sound cone area 403 represents all the longitudinal waves that can propagate in the oxide, such as dielectric layers 232, 233, 234 in FIG. 2. Sound cone area 404 represents the shear waves that can propagate in the dielectric layers. Region 404 has a shallower slope because the speed of sound in the oxide is lower than the speed of sound in silicon. In the region 405 below region 404, plane waves cannot propagate into the bulk silicon, but they can propagate into the dielectric. The speed of sound (c) sets the slope of the line defining each region (sound cone) 401, 404. Each line is described by expression (1).

$$\omega = ck_x \quad (1)$$

Plot line 406 below the region 404 represent waves that cannot propagate into bulk silicon nor into dielectric. Therefore, this mode creates a "trapped" mode, that is referred to herein as a "guided mode." The FeCap creates a "slow wave" structure for a very specific frequency. This mode line cannot propagate into the bulk silicon or bulk dielectric because it has a much slower wave velocity. In this simulation example, the specific guided mode frequency is approximately 700 MHz, as indicated at 408 where $k_x a = \pi$.

The result illustrated by guided mode plot line 406 is similar to Snell's law in optics that defines an angle of refraction when a ray of light passes across a boundary separating two media having different speeds of light. In this case, since the oxide and silicon have different speeds of sound, total internal reflections are formed at the guided mode frequency from bulk silicon on the bottom of the FeCap cell and bulk oxide on the top of the cell.

Guided mode plot line 407 is a second guided mode that starts to appear as the pitch of the FeCaps gets smaller and the resulting operating frequency gets higher.

Referring again to FIG. 3, the simulation illustrates operation at the guided frequency of approximately 700 MHz. The shaded regions on upper plate 306 and lower plate 304 indicate that stress only occurs around the FeCap and does not propagate down into bulk silicon or up into bulk oxide. Lightly shaded regions 335, 336 indicates the guided mode wave tries to penetrate, but can't; therefore, it cannot propagate vertically. Therefore, a waveguide is created that can confine the acoustic vibration at this high frequency of approximately 700 MHz.

Figure 5:
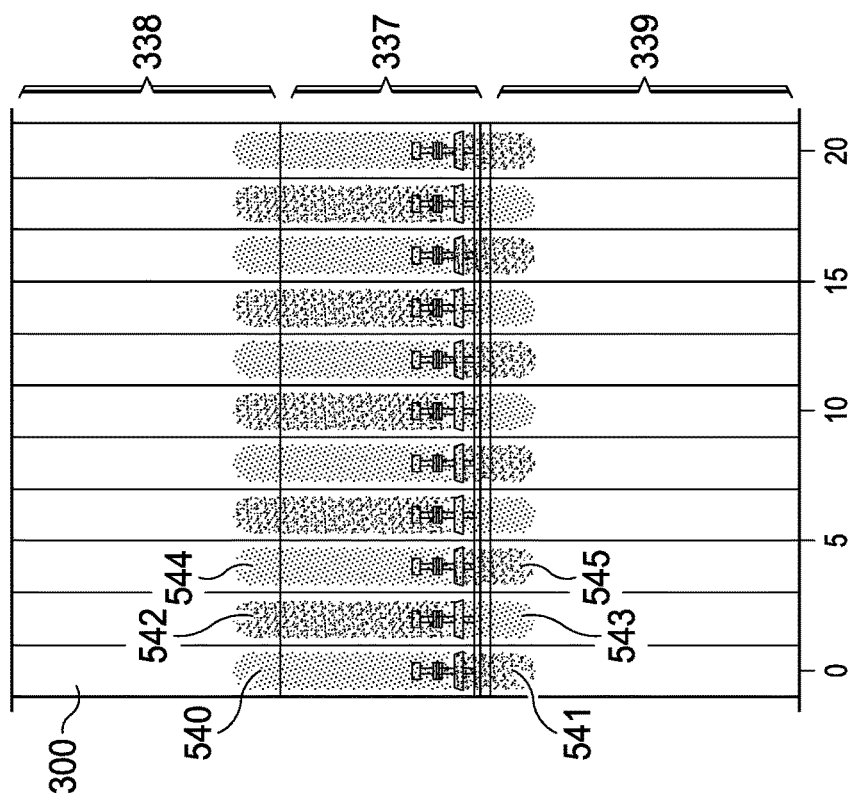
FIG. 5 is a cross-sectional view illustrating simulated oscillation within a row of FeCaps.
Figure 6:
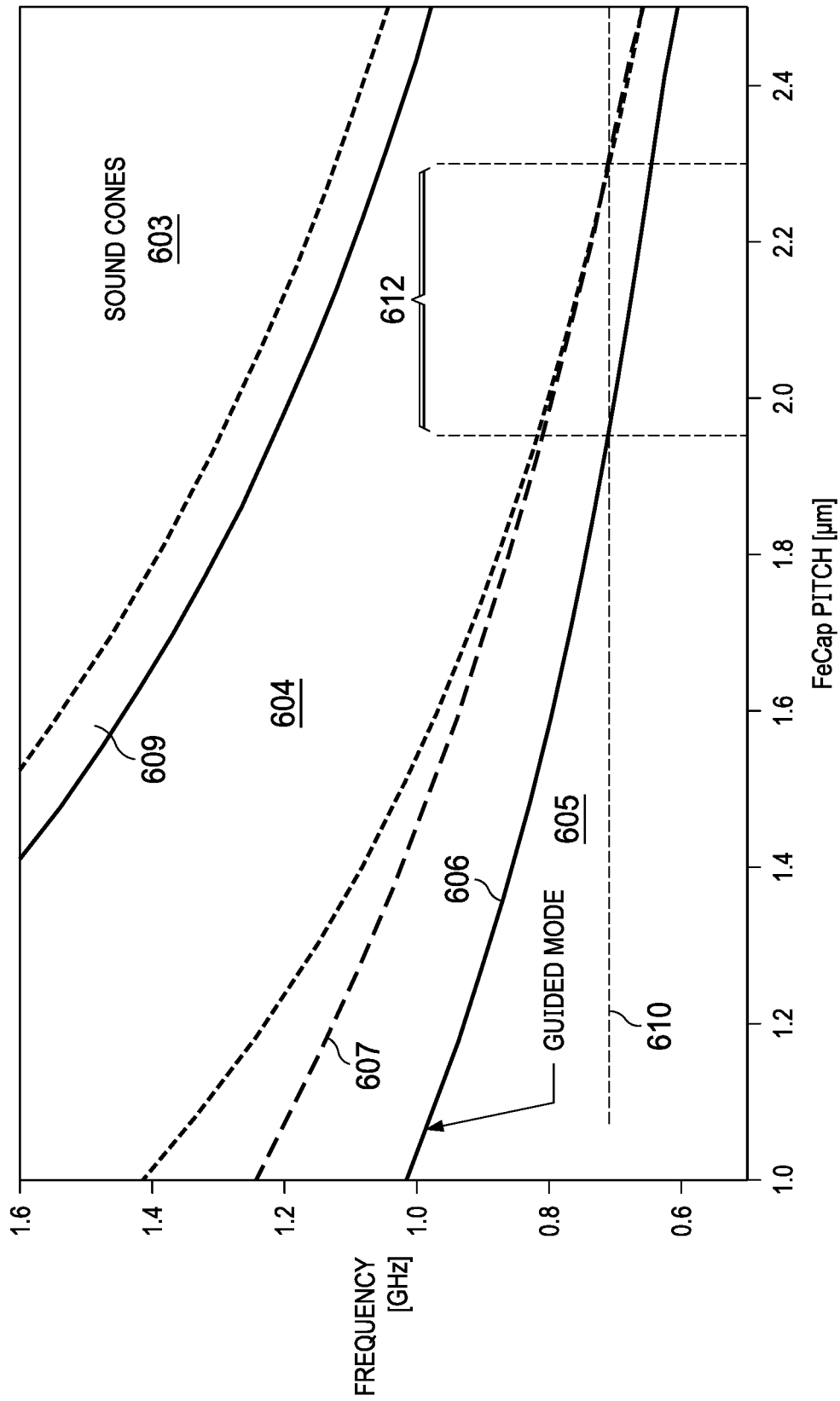
FIG. 6 is a dispersion plot illustrating a plot of guided mode operation for frequency vs FeCap pitch.

FIG. 5 is a cross-sectional view illustrating simulated oscillation at the guided mode frequency of approximately 700 MHz (see FIG. 4) within a row of FeCap unit cells that are all the same as FeCap unit cell 300. Regions 540, 543, 544, etc. represent a negative energy produced by an evanescent wave, while regions 541, 542, 545, etc. represent a positive energy produced by the evanescent wave. Thus, moving from cell to cell there is a 180 degree phase shift and resonant operation is occurring FIG. 6 is an example dispersion plot illustrating a plot of guided mode operation for frequency vs FeCap pitch. In this example plot, the pitch of the FeCaps in a simulated linear array is changed from 1.0 micron to 2.5 microns to create a family of dispersion plots similar to FIG. 4. The operating points indicated at $k_x$ equal one for each dispersion plot of the family is then plotted to form the dispersion plot of FIG. 6. The guided mode goes to a lower frequency as the size of FeCap is increased as indicated by guided mode plot line 606, see plot line 406 in FIG. 4. Guided mode plot line 607 illustrates another guided mode that starts to appear more clearly at lower FeCap pitch, see plot line 407 in FIG. 4. Both guided modes indicated by plot lines 606, 607 cannot propagate into the silicon and cannot propagate into the dielectric, thus they are guided.

Therefore, the linear array of FeCaps resonates at lower frequency as the pitch of the FeCaps is increased. Similarly, the sound cones go to a lower frequency. Sound cone 604 are shear modes that can propagate into the dielectric. Sound cone 609 are shear modes that can propagate into both bulk silicon and dielectric. Sound cone 603 are longitudinal modes that can propagate into the dielectric. Longitudinal modes that can propagate into bulk silicon occur at higher frequencies and are therefore not shown in FIG. 6.

In this example, a horizontal line 610 is drawn on this plot at approximately 715 MHz. This line intercepts guided mode line 606 at 1.95 µm. In the region 612 to the right, such as at 2.2 µm, horizontal line 610 is above the guided move line 606 and below sound cone 604, therefore propagation is blocked. In this manner, a reflector is created in a linear array of FeCaps.

The pitch of FeCaps in a reflector portion need to be only slightly larger than pitch of the FeCaps in the main waveguide portion of a linear array of FeCaps. In this example, FeCap pitches within the range of 2.0-2.3 µm as indicated at 612 are suitable for reflector mode operation. However, if the pitch is made too large, then operation above plot lone 604 will occur and propagation into bulk silicon and/or bulk oxide will occur.

The width and pitch of the caps are selected based on numerical FEM simulation to achieve the best energy confinement. The lithography limit of the process sets the minimum possible cap size and pitch. While such minimum process dimension may result in a functional device, they don't necessarily result in a good performance. The optimal dimensions (width and spacing) varies according to the exact layer structure of the capacitors, surrounding dielectrics, and the different layer thicknesses. Both the pitch and width of the cap determine the resonance frequency of the device. However, as the pitch and width of the capacitors become larger, the resonance frequency drops with the wavelengths becoming larger. This causes longer evanescent wave "tails" in the bulk and BEOL layers. Depending on the exact composition of the process layers, there is an upper soft limit for the size and pitch of the capacitor. Beyond which, the wavelength at resonance frequency is too large, such that the waveguide structure in the FEOL appears to be "too thin" to achieve any practical guiding, generating significant losses in the bulk and the BEOL layers due to the very large evanescent tails.

Figure 7:
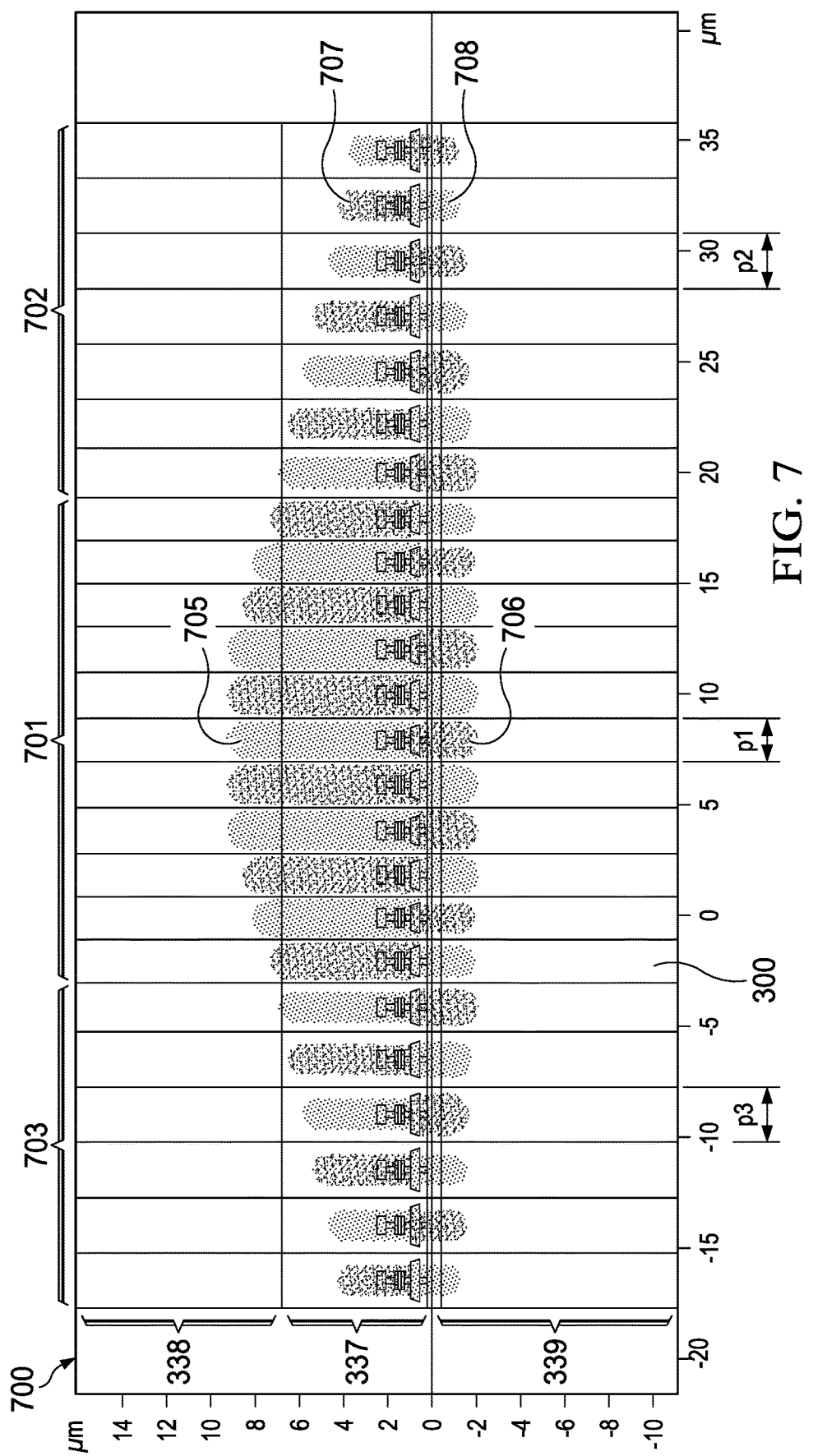
FIG. 7 is a cross-sectional view illustrating simulated operation of an ultrasonic resonator formed by a row of FeCaps.

FIG. 7 is a cross-sectional view illustrating simulated operation of an ultrasonic resonator 700 formed by a linear array of FeCaps. In this example, each FeCap cell is similar to FeCap 300 of FIG. 3. In a main waveguide region 701, the FeCaps have a pitch p1 that is selected to produce a guided mode of operation at a selected frequency. The respective pitches p2 of FeCaps in region 702 and p3 in region 703 are selected to be larger than p1 so that regions 702 and 703 act as reflectors at the selected frequency for the main waveguide region 701.

In this example, pitch p1 for the FeCaps in the main waveguide region 701 is selected to produce guided mode operation at approximately 715 MHz. Referring to FIG. 6, the respective pitches of the FeCaps in region 701 is selected to be approximately 1.95 μm. The respective pitches of the FeCaps in regions 702, 703 are selected to reflect the selected 715 MHz signal. Referring to FIG. 6, the respective pitch of the FeCaps in reflector regions 702, 703 is selected to be larger than approximately 2.0 μm and smaller than approximately 2.3 μm. Thus, a 715 MHz signal cannot propagate to the left or to the right in the reflector regions 702, 703 and cannot propagate up or down in the main waveguide regions 701. Therefore, the example linear array of FeCaps 700 operates as a resonator and produces a resonant signal at a frequency of 715 MHz.

Theoretically there is no maximum or minimum limits for the length of the array of FeCaps. The theory assumes that there are "many" periods such that the structure maintains translational symmetry (~ periodic) at each point in space. Practically, a minimum of four or five periods is necessary for main waveguide portion 701 and for reflector portion 702 in order for the device to work properly. There is no upper limit on the number of periods, but the more the better as the device approaches the theoretical case of translational symmetry at each point. In this example, the length of main waveguide portion 701 is approximately 20 μm.

Figure 8:
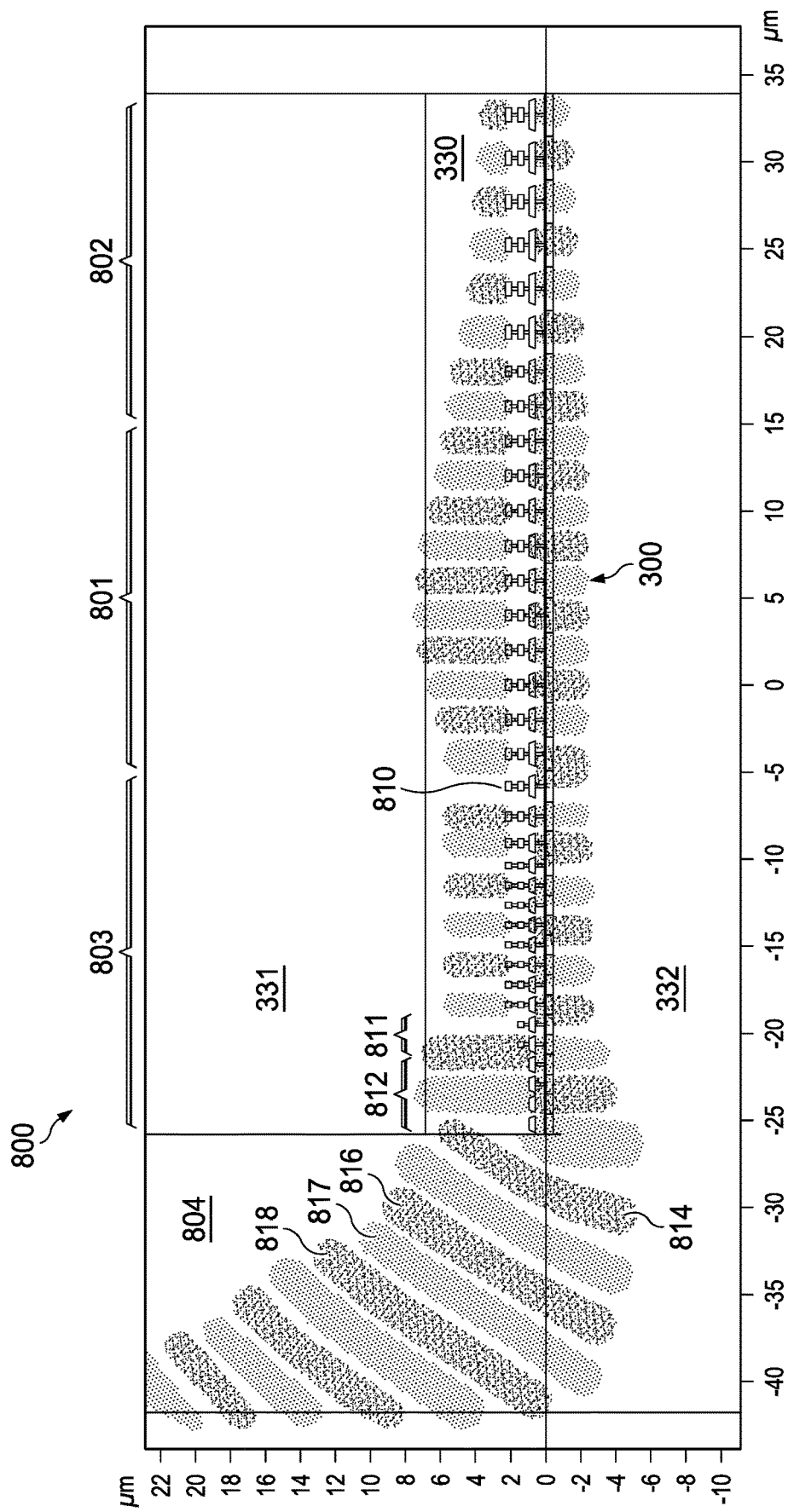
FIG. 8 is a cross-sectional view illustrating simulated operation of an ultrasonic transmitter formed by a row of FeCaps.

As the width of the reflector FeCaps are in reflector portion 702 is increased, a larger mismatch in impedance and larger reflections (and scattering) will be produced. Therefore, a smaller number of reflector sections will be needed. For example designs, the respective pitch/width of the reflector FeCaps can range from 10% to 50% wider than the main waveguide FeCaps. Smaller reflectors are also possible, at the expense of larger number required. Larger reflectors are also possible, however, at some point, the cut-off of another mode starts to be low enough, and the reflector will fail. Reflectors can have progressive pitch/width variations, or abrupt pitch/width variations FIG. 8 is a cross-sectional view illustrating simulated operation of an ultrasonic transmitter 800 formed by a linear array of FeCaps. In this example, the FeCap cells in the main waveguide region 801 and reflector region are similar to FeCap 300 of FIG. 3, with the respective pitches selected to operate in waveguide mode at approximately 715 MHz.

In order for transmitter 800 to radiate an ultrasonic signal produced by main waveguide region 801, the signal must be coupled into the radiation medium adjacent to the transmitter device represented by region 804 in this example simulation. In this example simulation, radiation medium 804 is given ultrasonic properties that are approximately the same as the oxide layers above the FeCaps, such as oxide layers 232, 233, 234 in FIG. 2B and PML region 338.

If the respective pitch of the FeCaps in transition region 803 is selected to be the same as the pitch within main waveguide region 801, then there would be no "radiator structure." The wave from the main waveguide region 801 will keep traveling in this section as well. However, it will incur a large reflection and scattering due to the abrupt truncation of the capacitor's period at boundary 814 between transition region 803 and radiation medium 804. In other words, there will be no matching to the radiation medium and therefore very poor radiation efficiency. This configuration may work as a low-Q resonator but is not a good radiator.

A gradual transition in the sizing of the FeCaps in the transition region 803 facilitates a matching of ultrasonic impedance between the transition region 803 and the radiation medium 804. In this example, radiation medium 804 is simulated as oxide, which can be the same oxide that forms the various oxide layers in region 337, such as 232, 233, 234 (FIG. 2). Referring to FIG. 6, for a selected frequency of 715 MHz indicated by horizontal line 610, reducing the FeCap pitch moves the operating mode to the left into region 605 in which plane waves cannot propagate into the bulk silicon but in which they can propagate into the oxide.

In this example, the pitch and width of the FeCaps in transition region 803 are gradually reduced. For example, beginning at FeCap 810, the pitch and width of the FeCaps in transition region 803 is gradually reduced to a small as practical for the CMOS fabrication process that is being simulated. In addition to reducing the pitch and width, in a portion of FeCaps indicated at 811 the second layer via 318 and contact 316 (FIG. 3) are removed. Additionally, in a portion of FeCaps indicated at 812, the first layer via 312 and contact 314 (FIG. 3) is also removed. The top contacts and bottom vias of a few of the FeCaps within portion 812 are removed to gradually reduce the physical size of the linear array of FeCap in transition portion 803. The object is to gradually reduce the physical size of the FeCap structure to thereby cause the ultrasonic impedance of transition portion 803 to gradually transition to match the ultrasonic impedance of radiation medium 804.

The gradual reduction in size and pitch of the FeCaps in transition region 803 causes the ultrasonic signal generated in main waveguide region 801 to propagate through transition region 803 and then smoothly launch into radiation medium 804. Within transition portion 803, the ultrasonic signal begins to propagate upward into the BEOL oxide layers and thereby a radiation structure is formed by the FeCaps in transition portion 803. Signal waves 816, 817, 818 are representative of the ultrasonic signal that is launched into radiation medium 804 while staying above bulk silicon substrate region 339.

Figure 9:
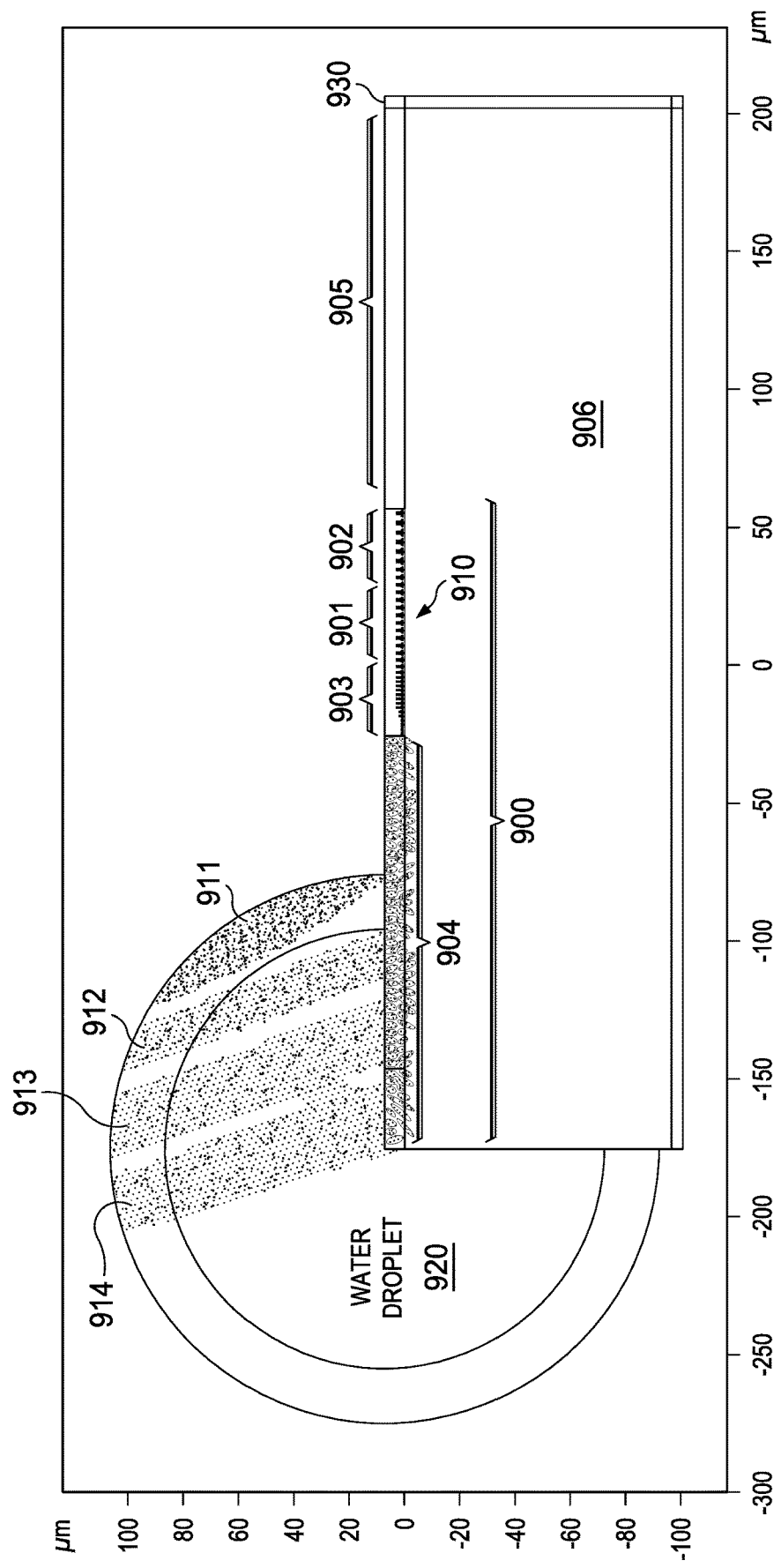
FIG. 9 is a cross-sectional view of an FeCap ultrasonic transducer coupled to a drop of water.

FIG. 9 is a cross-sectional view of CMOS IC 930 illustrating simulated operation of an example FeCap ultrasonic transducer 900 coupled to a drop of water 920. Transducer 900 includes a linear array of FeCaps 910 that is similar to the linear array of FeCaps illustrated in FIGS. 2A, 2B and a radiation medium 904 similar to radiation medium 804 in FIG. 8. As described with regards to FIG. 8, in a main waveguide portion 901 of the linear array of FeCaps have a respective pitch and width for each FeCap selected to produce guided mode operation for a selected frequency. In this example, a respective pitch of approximately 1.95 µm and a width is selected to produce guided mode operation at approximately 715 MHz. A respective pitch of a reflector portion 902 of the FeCaps is selected to be larger than the respective pitch in portion 901 to provide a reflector mode of operation at the selected frequency of 715 MHz. In this example, the respective pitch for the FeCaps in portion 902 is selected to be within a range of 2.0-2.3 µm.

Portion 903 of the FeCaps in linear array 910 form a transition region similar to transition region 803 in FIG. 8. The respective pitch and width of the FeCaps in portion 903 are gradually reduced to facilitate a matching of ultrasonic impedance between the transition region 903 and the radiation medium 904.

Radiation medium 904 forms a traveling wave radiator. The structure needs to be long enough to allow multiple wavelengths along the surface and act like a true traveling wave radiator. Simulations indicate that the length of radiation medium 904 should be at least five to ten wavelengths long in the upper BEOL materials to produce a good radiation pattern. The longer the radiation medium 904 the more beams that will get launched and the more efficient the radiation will be. In this example, four beams 911, 912, 913, 914 are being launched from radiation medium 904 into water drop 920. In this example, radiation medium 904 is approximately 150 µm long.

However, in another application, multiple beams might not be desired by the application. Therefore, the length of the radiator medium may be selected depending on a desired radiation pattern for a target application.

In this example, radiation medium 904 is formed by layers of dielectric that are formed during the BEOL processing of CMOS device 930. Portion 905 of CMOS IC 930 includes oxide formed during the BEOL processing of CMOS device 930. In an example, portion 905 also includes CMOS circuitry that is coupled to transducer 900 to provide control and processing of ultrasonic signals for transducer 900. Substrate 906 is bulk silicon. In this example, at least two interconnect layers are fabricated over transducer 900 and the CMOS circuitry in region 905 to provide interconnects. Contacts within transducer 900, such as contacts 214, 216 (FIG. 2B), can connect to the interconnect layers.

The CMOS circuitry within region 905 includes circuitry to generate an ultrasonic signal that is coupled to transducer 900 via the interconnect layers.

In an application, transducer 900 may be interfaced to a variety of targets in order to evaluate the target using ultrasonic imaging techniques. For medical imaging, ultrasonic transducer 900 may be interfaced to a human or animal body in order to "see" into the body. For simulation purposes, water is similar to the composition of human and animal bodies. As illustrated by waves 911, 912, 913, 914, etc., an ultrasonic wave produced by main waveguide portion 901 and reflector portion 902 travels down transition portion 903 and then into radiation region 904. The 715 MHz ultrasonic wave propagates through the dielectric that makes up radiation region 904 and then launches into the surrounding media. Simulated water drop 920 illustrates how the launched ultrasonic wave propagates as waves 911, 912, 913, 914, etc. through water drop 920.

The ultrasonic wavelength in water of the 715 MHz signal is approximately 2 µm, which is ideal for very high-resolution short-range ultrasonic imaging applications. Contrast this to prior techniques that use an ultrasonic signal with a frequency of 10 MHz, for example; the wavelength in water is much larger and therefore a resulting image resolution is less than an image derived from a 715 MHz ultrasonic signal.

Figure 10C:
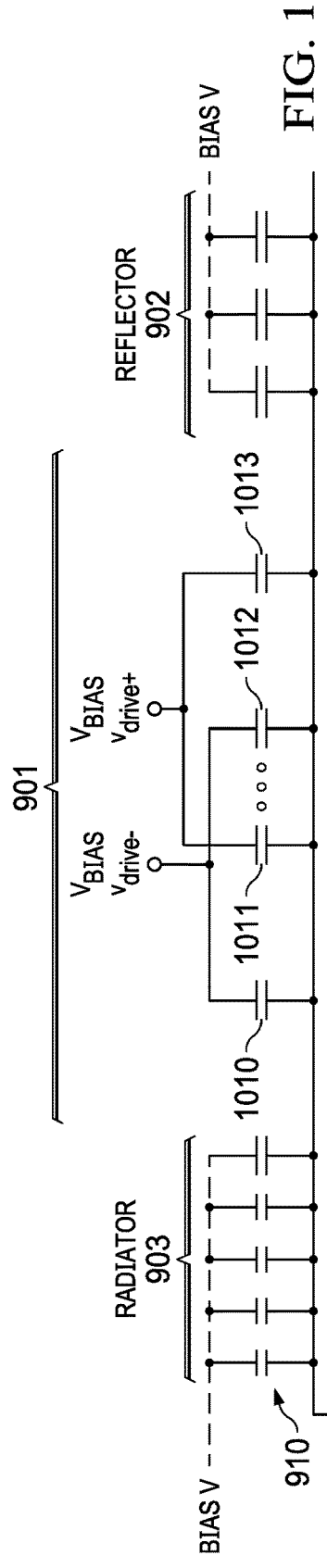

FIGS. 10A, 10B, 10C are schematics of various example FeCap connection schemes for transducer 900 in FIG. 9. In FIG. 10A, all the FeCaps in the radiator structure in portion 903, in the main waveguide in portion 901 and in the reflector in portion 902 have their bottom plates connected together and connected to a ground reference. The top plates of the FeCaps in portions 902, 903 are left floating. An ultrasonic excitation signal is applied to alternating ones of the upper plates in portion 901. In this example, the excitation signal is a 715 MHz signal that is provided by circuitry on CMOS IC 930 (FIG. 9). A positive excitation signal Vdrive+ is applied to every other one of the FeCaps in portion 901, such as FeCaps 1011, 1013 while a negative excitation signal Vdrive− is applied to the intervening FeCaps, such as FeCaps 1010, 1012.

In FIG. 10B, all the FeCaps in the radiator structure in portion 903, in the main waveguide in portion 901 and in the reflector in portion 902 have their bottom plates connected together and connected to a ground reference. The top plates of the FeCaps in portions 902, 903 are tied to the ground reference. An ultrasonic excitation signal is applied to the upper plates in portion 901. In this example, the excitation signal is a 715 MHz signal that is provided by circuitry on CMOS IC 930 (FIG. 9). A positive excitation signal Vdrive+ is applied to every other one of the FeCaps in portion 901, such as FeCaps 1011, 1013 while a negative excitation signal Vdrive− is applied to the intervening FeCaps, such as FeCaps 1010, 1012.

In FIG. 10C, all the FeCaps in the radiator structure in portion 903, in the main waveguide in portion 901 and in the reflector in portion 902 have their bottom plates connected together and connected to a ground reference. The top plates of the FeCaps in portions 902, 903 are tied to a bias voltage reference. An ultrasonic excitation signal is applied to the upper plates in portion 901. In this example, the excitation signal is a 715 MHz signal that is provided by circuitry on CMOS IC 930 (FIG. 9). A positive excitation signal Vdrive+ is applied to every other one of the FeCaps in portion 901, such as FeCaps 1011, 1013 while a negative excitation signal Vdrive− is applied to the intervening FeCaps, such as FeCaps 1010, 1012.

Connecting the top plates of the FeCaps in the reflector portion 902 in FIGS. 10B and 10C increases the attenuation slightly as compared to FIG. 10A where the top plates of the FeCaps in reflector portion 902 are left floating.

Figure 11:
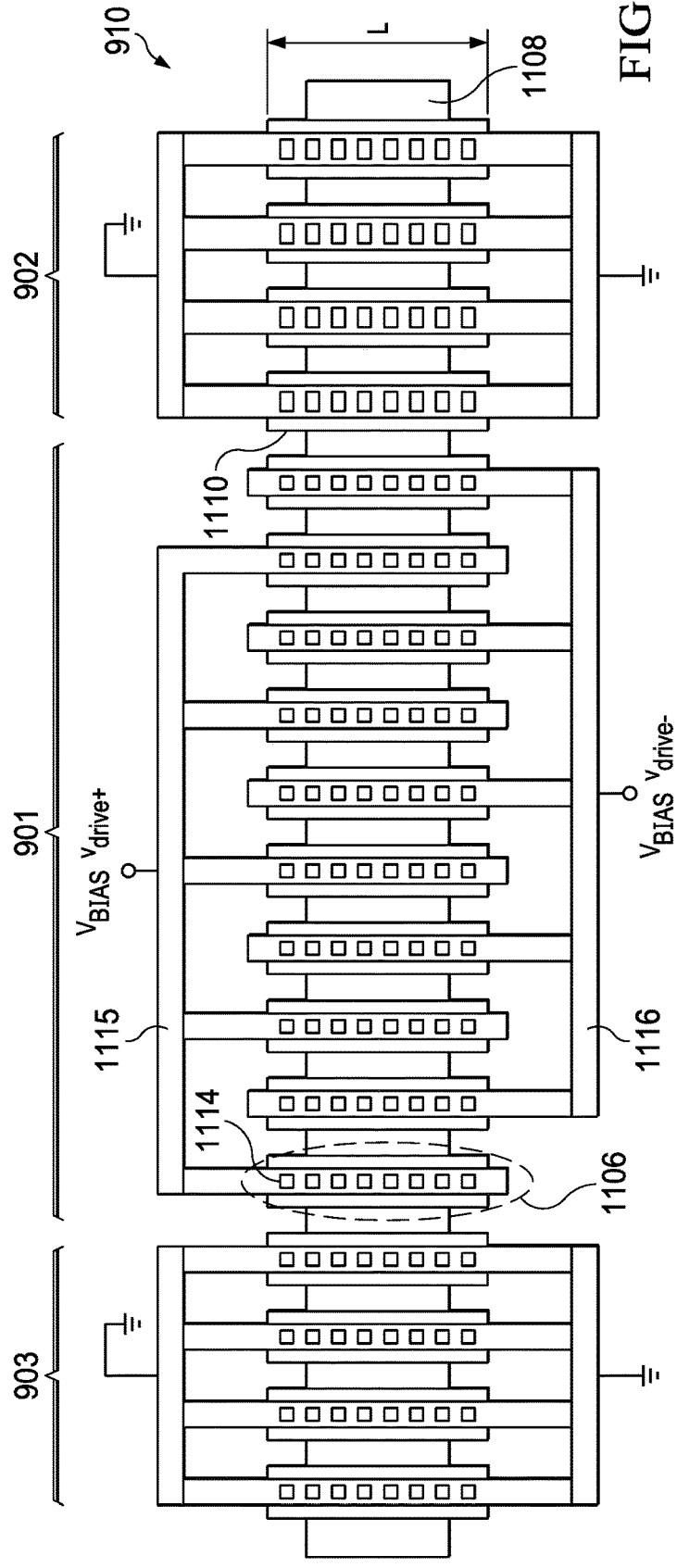
FIG. 11 is a top view of an example FeCap ultrasonic transducer.

FIG. 11 is a top view of an example linear array of FeCaps 910 for ultrasonic transducer 900 in FIG. 9. FeCap 1110 is representative of all the FeCaps in linear array 910. FeCap 1110 is similar to FeCap 210 described in more detail with regard to FIGS. 2A, 2B. The upper plate of each FeCap is visible in this example, such as upper plate 1106. In this example, a continuous poly-Si layer 1108 spans across all the FeCaps in linear array 910 to form the bottom plate routing interconnect.

In this example, the FeCaps are interconnected as schematically illustrated in FIG. 10B. Vdrive+ is coupled to the top plate of every other FeCap in main waveguide portion 901 by signal line 1115 that is connected to respective first level contacts, such as first level contacts 1114. Similarly, Vdrive− is coupled to the top plate of intervening FeCaps in portion 901 by signal line 1116 that is connected to respective first level contacts.

Figure 12:
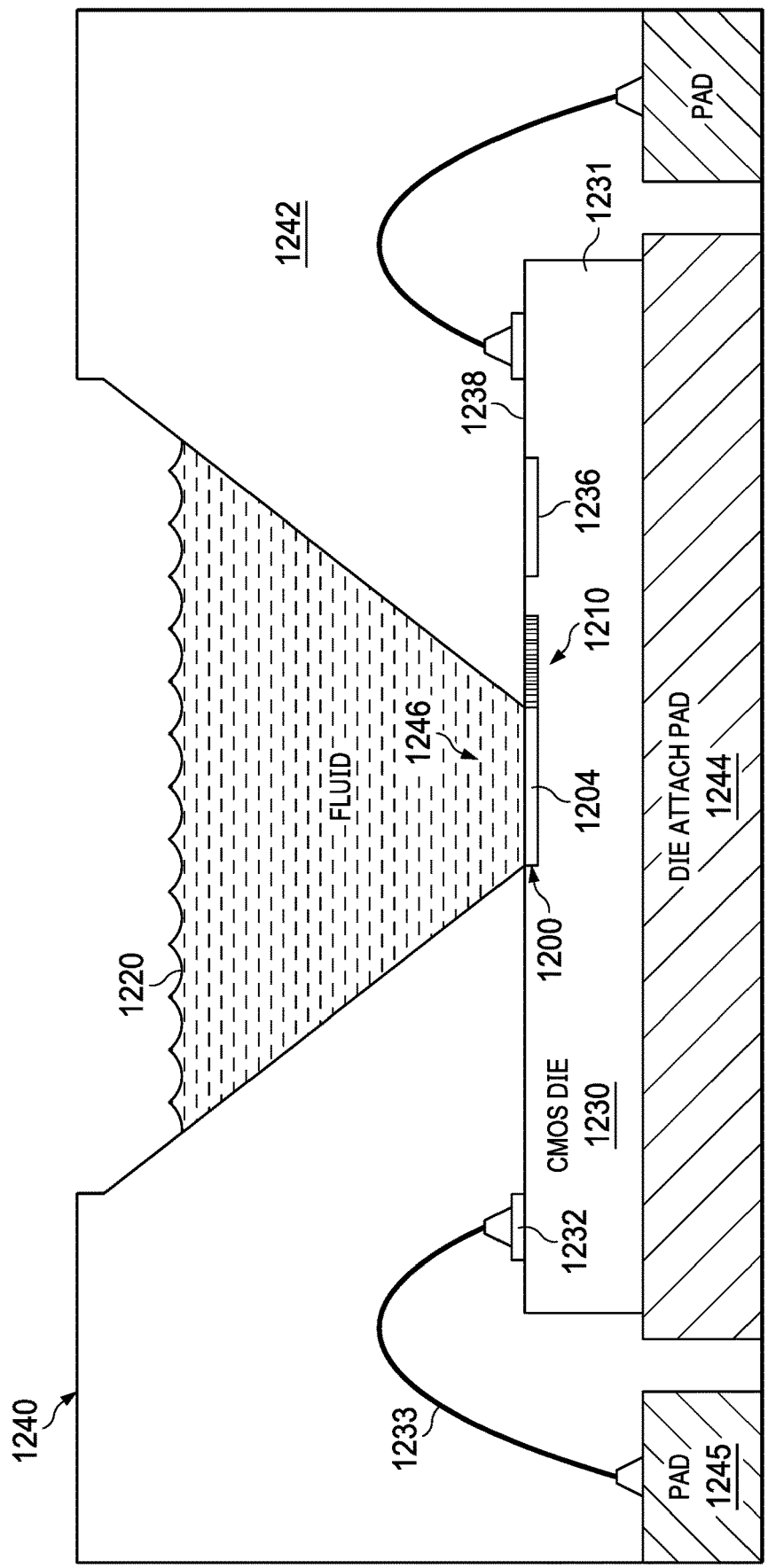
FIG. 12 is a cross-sectional view of an example packaged FeCap ultrasonic transducer.

FIG. 12 is a cross-sectional view of an example packaged IC 1240 that includes FeCap ultrasonic transducer 1200. FeCap ultrasonic transducer 1200 is similar to FeCap transducer 900 (FIG. 9) and includes a linear array of FeCaps 1210 arranged into a main waveguide portion, a reflector portion, and a transition portion. Ultrasonic transducer 1200 also includes radiating medium 1204. Ultrasonic transducer 1200 is fabricated on a CMOS die 1230 using known CMOS fabrication techniques. Substrate 1231 is bulk silicon. Various circuitry 1236 is formed on substrate 1231 during FEOL processing, including linear array of FeCaps 1210. Metal interconnect layers 1238 and oxide insulating layers are formed during BEOL processing.

Die bond pads, such as pad 1232, are also formed on substrate 1231 and interconnected to the circuitry 1236 by signal lines formed in one or more metal interconnect layers 1238 of the CMOS die 1230.

CMOS die 1230 is mounted on a die attach pad 1244 that is part of a metallic leadframe that includes leadframe bond pads, such as pad 1245, to provide connection to external circuitry. Bond wires, such as bond wire 1233, connect die bond pads on CMOS die 1230 to respective leadframe bond pads.

CMOS die 1230 is encapsulated by mold compound 1242 using known or later developed packaging techniques. In this example, on opening 1246 is provided in the finished package to allow radiation medium 1204 to interface with an externally provided fluid 1220. For example, packaged IC 1240 may be submerged in a tank or other container that contains fluid 1220. In another example, packaged IC 1240 may be part of a medical ultrasonic imaging device. In that case, fluid 1220 may be a liquid or gel that provides an interface between radiating medium 1204 and a human or animal body, for example.

In this example, the packaged IC is a quad flat no-leads package. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of printed circuit boards (PCBs) without through-holes. Flat no-lead is a near chip scale package plastic encapsulated package made with a planar copper leadframe substrate. Perimeter lands on the package bottom provide electrical connections to the PCB. Other examples may be packaged using other known or later developed packaging technologies, such as a quad-flat package, a ball grid array, etc.

FIG. 13 is a flow diagram illustrating operation of an ultrasonic transmitter on a CMOS IC. As described in more detail hereinabove with reference to FIGS. 8, 9 and elsewhere, a linear array of FeCaps fabricated on a CMOS IC can operate as an ultrasonic transmitter. A waveguide portion of the array of FeCaps positioned in the middle of the row each have a respective width and pitch that is selected to produce a guided mode of operation for a selected ultrasonic frequency. A reflector portion of the array of FeCaps is positioned at a one end of the row. Each FeCap in the reflector portion has a respective width that is larger than the respective width of the FeCaps in the waveguide portion. A radiator portion of the array of FeCaps is positioned at the other end of the row. Each FeCap in the radiator portion has a respective width that is smaller than the respective width of the FeCaps in the waveguide portion. A radiator medium is coupled to the radiator portion of the array of FeCaps.

At 1301, an ultrasonic signal is applied to the waveguide portion of the FeCaps. This ultrasonic signal may be generated by circuitry within the IC in which the FeCaps are located.

At 1302, an ultrasonic wave is produced by the waveguide portion of the FeCaps. The frequency of the ultrasonic signal is selected to match a guided mode of operation that is produced within the waveguide portion of FeCaps.

At 1303, a portion of the ultrasonic wave is reflected by the reflector portion. The reflected wave reinforces the ultrasonic signal that is formed within the waveguide portion.

At 1304, a portion of the ultrasonic signal is radiated from a radiating structure formed by the radiator portion of FeCaps. The respective width and structure of the FeCaps in the radiator portion is gradually reduced in size in order to match the acoustic impedance of the radiating structure to the acoustic impedance of the radiating medium.

At 1305, the radiated portion is propagated through the radiation medium that may be used to direct the radiated wave in a particular direction. For example, the radiation medium may direct the wave to an opening in encapsulation of the IC, such as illustrated in FIG. 12.

As described hereinabove, one or more ultrasonic transducers and acoustic processing circuitry is integrated inside standard CMOS IC. A completely solid structure is formed that contains no air gaps or membranes.

High frequency operation in the range of 700 MHz can be used for very high resolution in a short range to provide high-resolution ultrasonic imaging.

Applications include: surface inspection, medical imaging, surgical guidance, vein/artery internal imaging, microfluidic fluid flow measurement and metering, insulin/medicine micro-flow metering, blood flow measurement, on-chip acoustic communication, isolation between voltage domains, paint inspection, etc.

Other Embodiments

In described examples, a single ultrasonic transducer is illustrated. However, in another example two or more ultrasonic transducers may be fabricated on a single CMOS IC. As illustrated in FIG. 9 ultrasonic transducer 900 is less than 250 μm long including radiating medium 904. The plates on the linear array of FeCaps 910 is are only 10 μm long. Since the overall size of ultrasonic transducer 900 is only approximately 250 μm by 10 μm, many ultrasonic transducers may be fabricated on a single CMOS IC.

In described examples, an ultrasonic transducer operates at a frequency of 715 MHz. In other examples, the width of the FeCaps in the waveguide, reflector, and radiating portion of the linear array of FeCaps may be selected to produce guided ultrasonic operation across a frequency range of 600-900 Mhz or more. The lowest frequency depends on the available material thickness, whereas the highest frequency depends on the lithographic capabilities of the technology. Using existing technology, the range can be pushed down to 350 MHz and pushed up above 1 GHz.

In described examples, a single layer of FeCaps is illustrated. In another embodiment, multiple layers of FeCaps and/or multiple layers of thick tungsten may be implemented using three-dimensional integration techniques. In an example, the multiple layers may be fabricated directly on top of each other. In another example, a delay structure can be fabricated in a higher metal layer in the BEOL stack. A radio frequency metal-insulator-metal (RF-MIM) capacitor can be fabricated in the upper BEOL layers in order to move away from parasitics and losses in the substrate. Using multiple layers of FeCaps, RF-MIM capacitors, and/or multiple layers of thick tungsten, it is possible to extend the frequency range down to the tens of MHz range. For example, a system may be operated at 20 MHz or less using these techniques.

In described examples, an ultrasonic signal is transmitted from an ultrasonic transmitter. In another example, a same structure may be used to receive an ultrasonic signal. By controlling transmit and receive operation, the same structure can function as a transducer.

In some examples, only a single transmit device or a single receive device may be implemented. In another example, only a single transducer device may be implemented.

In described examples, contacts in two metal layers are gradually removed to form the transition structure. In another example, there may be three or more layers of interconnect over the linear array of FeCaps. In this case, contacts and/or vias from all of the layers may be removed in a gradual manner to contribute to a gradual reduction of physical size of the FeCap cells to create the transition structure.

In described examples in which the metal layers are copper, the copper has an acoustic impedance similar to oxide. Therefore, the copper contacts and vias have only a minor effect on acoustic impedance. However, in another example in the metal layers may be aluminum, which has a significantly different acoustic impedance than the oxide. In this case, gradually removing the aluminum contacts/vias to form a tapered transition structure has a larger effect. Similarly, gradually changing the size of other types of conductive structures used for interconnects may have varying effects on the acoustic impedance.

In described examples, the respective width of the FeCaps in the main waveguide portion is approximately equal. However, the respective widths may vary somewhat due to normal fabrication tolerances. In examples, there may a variation of up to 5%.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An ultrasonic transducer comprising:
    a substrate;
    a linear array of ferroelectric capacitors (FeCaps) each having a respective length and a respective width arranged in a single row on the substrate, such that the length of each of the array of FeCaps is perpendicular to an axis of the row;
    a waveguide portion of the array of FeCaps positioned in the middle of the row each having a respective first width;
    a reflector portion of the array of FeCaps positioned at a first end of the row, wherein each FeCap in the reflector portion has a respective width that is larger than the first width; and
    a radiator portion of the array of FeCaps positioned at a second end of the row opposite the first end, wherein each FeCap in the radiator portion has a respective width that is smaller than the first width.

2. The ultrasonic transducer of claim 1, wherein the respective width of the FeCaps in the radiator portion gradually reduces from the first width to a second width.

3. The ultrasonic transducer of claim 1, wherein each of the array of FeCaps has a respective first conductive plate and a respective second conductive plate with a ferroelectric material between the first and second plates.

4. The ultrasonic transducer of claim 3, wherein the first conductive plate of at least one of the FeCaps in the radiator portion is connected to at least two contact pads, the first conductive plate of at least one of the FeCaps in the radiator portion is connected to only one contact pad, and the first conductive plate of at least one of the FeCaps in the radiator portion is not connected to a contact pad.

5. The ultrasonic transducer of claim 4, wherein at least one of the FeCaps in the radiator portion does not have a first conductive plate.

6. The ultrasonic transducer of claim 1, wherein the respective width of FeCaps in the reflector portion ranges within 10% to 50% larger than the first width.

7. The ultrasonic transducer of claim 6, wherein the FeCaps in the reflector portion have a respective width that progressively increases.

* * * * *